(12) United States Patent
Lee et al.

(10) Patent No.: US 9,947,825 B2
(45) Date of Patent: Apr. 17, 2018

(54) METHOD OF MANUFACTURING SOLAR CELL

(71) Applicant: LG ELECTRONICS INC., Seoul (KR)

(72) Inventors: Kyoungsoo Lee, Seoul (KR); Sangwook Park, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 15/381,751

(22) Filed: Dec. 16, 2016

(65) Prior Publication Data

US 2017/0179333 A1  Jun. 22, 2017

(30) Foreign Application Priority Data

Dec. 18, 2015  (KR) .................. 10-2015-0181748
Nov. 18, 2016  (KR) .................. 10-2016-0154395

(51) Int. Cl.
| | | |
|---|---|---|
| H01L 31/20 | (2006.01) | |
| H01L 31/18 | (2006.01) | |
| H01L 31/0224 | (2006.01) | |
| H01L 31/0376 | (2006.01) | |
| H01L 31/0747 | (2012.01) | |

(52) U.S. Cl.
CPC .... *H01L 31/208* (2013.01); *H01L 31/022425* (2013.01); *H01L 31/0376* (2013.01); *H01L 31/03767* (2013.01); *H01L 31/0747* (2013.01); *H01L 31/1884* (2013.01); *H01L 31/202* (2013.01); *H01L 31/204* (2013.01)

(58) Field of Classification Search
None
See application file for complete search history.

(56) References Cited

U.S. PATENT DOCUMENTS

| | | | |
|---|---|---|---|
| 2006/0283496 A1* | 12/2006 | Okamoto | H01L 31/0747 136/244 |
| 2012/0094430 A1 | 4/2012 | Jung | |
| 2014/0287583 A1* | 9/2014 | Liu | H01B 1/22 438/660 |
| 2015/0364361 A1 | 12/2015 | Lee et al. | |
| 2017/0162722 A1* | 6/2017 | Fu | H01L 31/0201 |

FOREIGN PATENT DOCUMENTS

EP    2955761 A1    12/2015

* cited by examiner

*Primary Examiner* — Asok K Sarkar
(74) *Attorney, Agent, or Firm* — Birch, Stewart, Kolasch & Birch, LLP

(57) ABSTRACT

Disclosed is a manufacturing method of a solar cell, including forming a photoelectric converter including an amorphous semiconductor layer, forming an electrode connected to the photoelectric converter, and performing a post-treatment by providing light to the photoelectric converter and the electrode.

24 Claims, 11 Drawing Sheets

METHOD OF MANUFACTURING SOLAR CELL

CROSS-REFERENCE TO RELATED APPLICATIONS

This application claims the priority benefit of Korean Patent Applications No. 10-2015-0181748, filed on Dec. 18, 2015 and No. 10-2016-0154395, filed on Nov. 18, 2016 in the Korean Intellectual Property Office, all of which are incorporated herein by reference.

BACKGROUND OF THE INVENTION

1. Field of the Invention

Embodiments of the present invention relate to a method of manufacturing a solar cell, and more particularly, to a method of manufacturing a solar cell including an amorphous semiconductor layer.

2. Description of the Related Art

Recently, due to depletion of existing energy resources, such as oil and coal, interest in alternative sources of energy to replace the existing energy resources is increasing. Most of all, solar cells are popular next generation cells to convert sunlight into electrical energy.

Solar cells may be manufactured by forming various layers and electrodes based on some design. The efficiency of solar cells may be determined by the design of the various layers and electrodes. In order for solar cells to be commercialized, the problem of low efficiency needs to be overcome, and thus, various layers and electrodes are being designed to maximize the efficiency of solar cells and various treatments are being performed with the goal of maximizing the efficiency of solar cells.

Accordingly, there is a demand for a method of manufacturing a solar cell, which includes a process of performing post-treatment on the solar cell so as to maximize the efficiency thereof based on the structure of the solar cell. In particular, there is a demand for a method of manufacturing a solar cell including an amorphous semiconductor layer, which may prevent deterioration of the amorphous semiconductor layer at a high temperature because the efficiency of the solar cell may be reduced by such deterioration of the amorphous semiconductor layer, or by implementation of a low-temperature process required to prevent the deterioration of the amorphous semiconductor layer.

SUMMARY OF THE INVENTION

Therefore, the present invention has been made in view of the above problems, and it is an object of the embodiments of the present invention to provide a method of manufacturing a solar cell, which may enhance the thermal stability and efficiency of the solar cell.

According to an aspect of the present invention, the above and other objects can be accomplished by the provision of a method of manufacturing a solar cell, the method including forming a photoelectric converter including an amorphous semiconductor layer, forming an electrode connected to the photoelectric converter, and performing a post-treatment by providing light to the photoelectric converter and the electrode.

BRIEF DESCRIPTION OF THE DRAWINGS

The above and other objects, features and other advantages of the embodiments of the present invention will be more clearly understood from the following detailed description taken in conjunction with the accompanying drawings, in which.

DETAILED DESCRIPTION OF THE EMBODIMENTS

Figure 1:
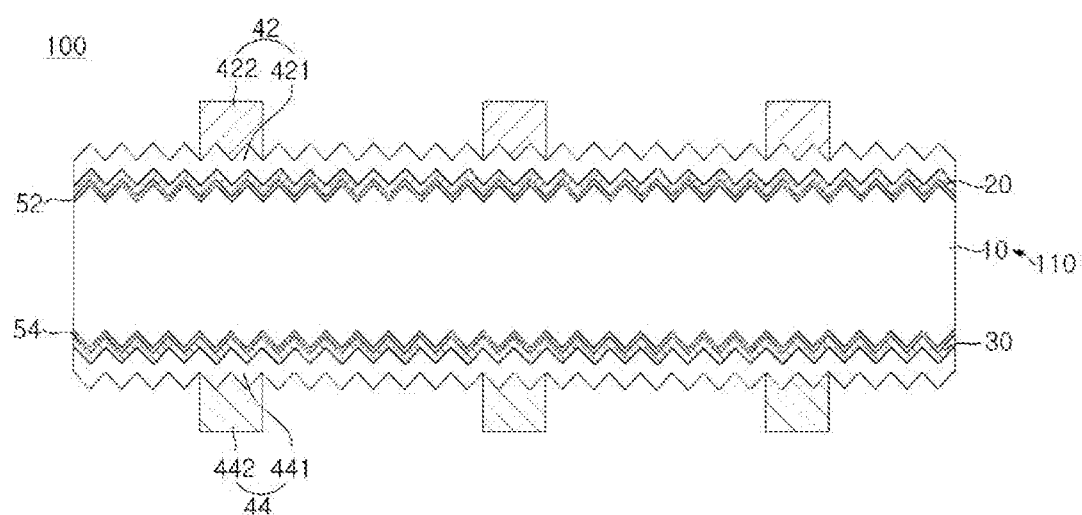
FIG. 1 is a sectional view illustrating an example of a solar cell, to which a method of manufacturing a solar cell according to an embodiment of the present invention may be applied.

Reference will now be made in detail to the embodiments of the present invention, examples of which are illustrated in the accompanying drawings. However, it will be understood that the present invention should not be limited to the embodiments and may be modified in various ways.

In the drawings, to clearly and briefly explain the present invention, illustration of elements having no connection with the description is omitted, and the same or extremely similar elements are designated by the same reference numerals throughout the specification. In addition, in the drawings, for more clear explanation, the dimensions of elements, such as thickness, width, and the like, are exaggerated or reduced, and thus the thickness, width, and the like of the present invention are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

Hereinafter, a method of manufacturing a solar cell according to an embodiment of the present invention will be described in detail with reference to the accompanying drawings. An example of the solar cell, to which the method of manufacturing the solar cell according to the embodiment of the present invention may be applied, will first be described, and thereafter, the method of manufacturing the solar cell, which includes a post-treatment operation of performing post-treatment on the solar cell, will be described.

FIG. 1 is a sectional view illustrating an example of the solar cell, to which a method of manufacturing the solar cell according to an embodiment of the present invention may be applied.

Referring to FIG. 1, the solar cell 100 according to the present embodiment includes a semiconductor substrate 110 including a base area 10, tunneling films 52 and 54 formed on the semiconductor substrate 110, conductive areas 20 and 30 formed on the respective tunneling films 52 and 54, and electrodes 42 and 44 connected to the respective conductive areas 20 and 30. In this instance, the tunneling films 52 and 54 may include a first tunneling film 52 formed on a first surface (hereinafter referred to as a "front surface") of the semiconductor substrate 110, and a second tunneling film 54 formed on a second surface (hereinafter referred to as a "back surface") of the semiconductor substrate 110. The conductive areas 20 and 30 may include a first conductive area 20 formed on the first tunneling film 52 at the front surface side of the semiconductor substrate 110, and a second conductive area 30 formed on the second tunneling film 54 at the back surface side of the semiconductor substrate 110. In addition, the electrodes 42 and 44 may include a first electrode 42 connected to the first conductive area 20, and a second electrode 44 connected to the second conductive area 30. This will be described below in more detail.

The semiconductor substrate 110 may be formed of crystalline semiconductors. In one example, the semiconductor substrate 110 may be formed of monocrystalline or polycrystalline semiconductors (e.g. monocrystalline or polycrystalline silicon). In particular, the semiconductor substrate 110 may be formed of monocrystalline semiconductors (e.g. a monocrystalline semiconductor wafer, and more specifically, a monocrystalline silicon wafer). When the semiconductor substrate 110 is formed of monocrystalline semiconductors (e.g. monocrystalline silicon) as described above, the solar cell 100 configures a monocrystalline semiconductor solar cell (e.g. a monocrystalline silicon solar cell). Such a solar cell 100, which is based on the semiconductor substrate 160 formed of monocrystalline semiconductors having high crystallinity and thus low defects, may have excellent electrical properties.

In the present embodiment, the semiconductor substrate 110 may include only the base area 10 without a separate doped area. When the semiconductor substrate 110 includes no separate doped area, for example, damage to the semiconductor substrate 110 and an increase in the amount of defects of the semiconductor substrate 110, which may be generated when forming the doped area, may be prevented, which may allow the semiconductor substrate 110 to have an excellent passivation property. Thereby, surface recombination, which occurs on the surface of the semiconductor substrate 110, may be minimized.

In the present embodiment, the semiconductor substrate 110 or the base area 10 may be doped with a first or second conductive dopant at a low doping density, thus being of a first or second conductive type. At this time, the semiconductor substrate 110 or the base area 10 may have a lower doping density, higher resistance, or lower carrier density than one of the first and second conductive areas 20 and 30, which is of the same conductive type as the semiconductor substrate 110 or the base area 10. In one example, in the present embodiment, the base area 10 may be of a second conductive type.

The front surface and/or the back surface of the semiconductor substrate 110 may be subjected to texturing so as to have protrusions. The protrusions may be configured as (111) faces of the semiconductor substrate 110 and may take the form of pyramids having irregular sizes. When the roughness of, for example, the front surface of the semiconductor substrate 110 is increased by the protrusions formed on the front surface via texturing, the reflectance of light introduced through, for example, the front surface of the semiconductor substrate 110 may be reduced. Accordingly, the quantity of light, which reaches the pn junction formed by the base area 10 and the first conductive area 20, may be increased, which may minimize shading loss. However, the embodiments of the present invention are not limited thereto, and no protrusions may be formed on the front surface and the back surface of the semiconductor substrate 110 via texturing.

The first tunneling film 52 is formed on the front surface of the semiconductor substrate 110, and the second tunneling film 54 is formed on the back surface of the semiconductor substrate 110.

The first and second tunneling films 52 and 54 may serve as a barrier for electrons and holes, thereby preventing minority carriers from passing through the first and second tunneling films 52 and 54 and allowing only majority carriers, which accumulate at the portions adjacent to the first and second tunneling films 52 and 54 and thus has a given amount of energy or more, to pass through the first and second tunneling film 52 and 54. At this time, the majority carriers, which have the given amount of energy or more, may easily pass through the first and second tunneling films 52 and 54 owing to tunneling effects.

Such a first or second tunneling film 52 or 54 may include various materials to enable the tunneling of the carriers, and for example, may include a nitride, semiconductor, or conductive polymer. In one example, the first or second tunneling film 52 or 54 may include a silicon oxide, silicon nitride, silicon oxide nitride, intrinsic amorphous semiconductor (e.g. intrinsic amorphous silicon), or intrinsic polycrystalline semiconductor (e.g. intrinsic polycrystalline silicon). At this time, the first and second tunneling films 52 and 54 may be formed of intrinsic amorphous semiconductor. In one example, the first and second tunneling films 52 and 54 may be configured as an amorphous silicon (a-Si) layer, an amorphous silicon carbide (a-SiCx) layer, or an amorphous silicon oxide (a-SiOx) layer. In this instance, because the first and second tunneling films 52 and 54 have properties similar to those of the semiconductor substrate 110, the surface properties of the semiconductor substrate 110 may be effectively improved.

At this time, the first and second tunneling films 52 and 54 may be formed over the entire front surface and the entire back surface of the semiconductor substrate 110. Accordingly, the first and second tunneling films 52 and 54 may provide the entire front surface and the entire back surface of the semiconductor substrate 110 with passivation effects, and may be easily formed without separate patterning.

In order to achieve sufficient tunneling effects, the thickness of the tunneling films 52 and 54 may be 5 nm or less, and may be within a range from 0.5 nm to 5 nm (e.g. within a range from 1 nm to 4 nm). When the thickness of the tunneling films 52 and 54 exceeds 5 nm, smooth tunneling does not occur, and consequently, the solar cell 100 may not operate. When the thickness of the tunneling films 52 and 54 is below 0.5 nm, it may be difficult to form the tunneling films 52 and 54 having a desired quality. Accordingly, in order to further improve tunneling effects, the thickness of the tunneling films 52 and 54 may be within a range from 1 nm to 4 nm. However, the embodiments of the present invention are not limited thereto, and the thickness of the tunneling films 52 and 54 may have any of various values.

The first conductive area 20 of a first conductive type may be formed on the first tunneling film 52. In addition, the second conductive area 30 of a second conductive type, which is the opposite of the first conductive type, may be formed on the second tunneling film 54.

The first conductive area 20 may include a first conductive dopant, and thus may be of a first conductive type. In addition, the second conductive area 30 may include a second conductive dopant, and thus may be of a second conductive type. In one example, the first conductive area 20 may come into contact with the first tunneling film 52, and the second conductive area 30 may come into contact with the second tunneling film 54. Thereby, the structure of the solar cell 100 may be simplified, and the tunneling effects of the first and second tunneling films 52 and 54 may be maximized. However, the embodiments of the present invention are not limited thereto.

Each of the first and second conductive areas 20 and 30 may comprise the same semiconductor material as the semiconductor substrate 110 (more specifically, a single semiconductor material, for example, silicon). In one example, each of the first and second conductive areas 20 and 30 may be configured as an amorphous silicon (a-Si) layer, an amorphous silicon carbide (a-SiCx) layer, or an amorphous silicon oxide (a-SiOx) layer. Thereby, the first and second conductive areas 20 and 30 may have properties similar to those of the semiconductor substrate 110, and thus may minimize a difference in properties that may occur when they comprise different semiconductor materials. However, because the first and second conductive areas 20 and 30 are formed on the semiconductor substrate 110 separately from the semiconductor substrate 110, the first and second conductive areas 20 and 30 may have a crystalline structure different from that of the semiconductor substrate 110, in order to be easily formed on the semiconductor substrate 110.

For example, each of the first and second conductive areas 20 and 30 may be formed by doping amorphous semiconductors, which may be easily manufactured via any of various methods, such as, for example, deposition, with a first or second conductive dopant. Thereby, the first and second conductive areas 20 and 30 may be easily formed using a simplified process. At this time, when the first and second tunneling films 52 and 54 are formed of intrinsic amorphous semiconductor (e.g. intrinsic amorphous silicon), the first and second conductive areas 20 and 30 may have, for example, an excellent bonding property and excellent electrical conductivity.

When the base area 10 is of a second conductive type, the first conductive area 20, which is of a first conductive type, configures an emitter area, which is of a different conductive type from that of the base area 10, and thus forms a pn junction with the base area 10. In addition, the second conductive area 30, which is of the same second conductive type as that of the semiconductor substrate 110, configures a back-surface field (BSF) area, which forms a back-surface field and has a higher doping density than the semiconductor substrate 110. Thereby, when the first conductive area 20, which configures the emitter area, is located at the front surface side of the semiconductor substrate 110, the path of light for a pn junction may be minimized.

However, the embodiments of the present invention are not limited thereto. In another example, when the base area 10 is of a first conductive type, the first conductive area 20 configures a front-surface field area, and the second conductive area 30 configures an emitter area.

A p-type dopant, which is used as the first or second conductive dopant, may be a group-III element, such as boron (B), aluminum (Al), gallium (Ga), or indium (In), and an n-type dopant may be a group-V element, such as phosphorus (P), arsenic (As), bismuth (Bi), or antimony (Sb). However, the embodiments of the present invention are not limited thereto, and any of various dopants may be used as the first or second conductive dopant.

When at least one of the first and second tunneling films 52 and 54 and the first and second conductive areas 20 and 30, which constitute a photoelectric converter, includes an amorphous semiconductor layer (e.g. an amorphous silicon layer), the solar cell 100 may be manufactured in a simplified manner, the semiconductor substrate 110 may have excellent properties because it includes only the base area 10 without a doped area, and the reduction in the thickness of the expensive semiconductor substrate 110 may reduce the cost of manufacturing the solar cell 100. However, the amorphous semiconductor layer may have many defects at the interface with the semiconductor substrate 110, which forms a heteroepitaxial junction, and may easily undergo deterioration in properties at a high temperature, thus requiring the application of a low-temperature process. When such a low-temperature process is applied, however, there is a limitation on reduction in, for example, the contact resistance between the conductive areas 20 and 30 and the electrodes 42 and 44. In consideration of this, in the solar cell 100 having the photoelectric converter including an amorphous semiconductor layer according to the present embodiment, a post-treatment operation ST50 (see FIG. 3), which may prevent deterioration of the amorphous semiconductor layer and may prevent an increase in the contact resistance between the conductive areas 20 and 30 and the electrodes 42 and 44, is performed. This will be described below in more detail with regard to the manufacturing method or the post-treatment method of the solar cell 100.

The first and second electrodes 42 and 44 are disposed on the respective first and second conductive areas 20 and 30 and are connected thereto. The first and second electrodes 42 and 44 may include the first electrode 42 disposed on and connected to the first conductive area 20, and the second electrode 44 disposed on and connected to the second conductive area 30.

The first electrode 42 may include a first electrode layer 421 and a second electrode layer 422, which are stacked over the first conductive area 20 in sequence.

In this instance, the first electrode layer 421 may be formed over (e.g. may be in contact with) the entire first conductive area 20. The term "entire" includes not only the case where the entire first conductive area 20 is covered without leaving an empty space or an empty area, but also the case where a portion of the first conductive area 20 is inevitably excluded. When the first electrode layer 421 is formed over the entire first conductive area 20, the carriers may easily reach the second electrode layer 422 by passing through the first electrode layer 421, which may result in reduced resistance in the horizontal direction. Because the first conductive area 20, which is configured as an amorphous semiconductor layer, may have relatively low crystallinity, and thus may reduce the mobility of the carriers, the provision of the first electrode layer 421 may reduce resistance when the carriers move in the horizontal direction.

Because the first electrode layer 421 is formed over the entire first conductive area 20, the first electrode layer 421 may be formed of a material capable of transmitting light (i.e. a light-transmitting material). That is, the first electrode layer 421 may be formed of a transparent conductive material in order to enable the transmission of light and the easy movement of the carriers. As such, the first electrode layer 421 does not prevent the transmission of light even if it is formed over the entire first conductive area 20. In one example, the first electrode layer 421 may include an indium tin oxide (ITO) or a carbon nano tube (CNT). However, the embodiments of the present invention are not limited thereto, and the first electrode layer 421 may include any of various other materials.

The second electrode layer 422 may be formed on the first electrode layer 421. In one example, the second electrode layer 422 may come into contact with the first electrode layer 421, which may simplify the structure of the first electrode 42. However, the embodiments of the present invention are not limited thereto, and various alterations are possible. For example, an alteration, in which a separate layer is present between the first electrode layer 421 and the second electrode layer 422, is possible. Meanwhile, although the second electrode layer 422 may have a single layer structure as illustrated, or may have a multi-layered structure unlike the illustration.

The second electrode layer 422, disposed on the first electrode layer 421, may be formed of a material having electrical conductivity superior to that of the first electrode layer 421. As such, the efficiency by which the second electrode layer 422 collects the carriers and the reduction in the resistance of the second electrode layer 422 may be further enhanced. In one example, the second electrode layer 422 may be formed of a metal, which is opaque or has lower transparency than the first electrode layer 421 and has electrical conductivity superior to that of the first electrode layer 421.

Because the second electrode layer 422 is opaque or has low transparency, and thus may prevent the entry of light, the second electrode layer 422 may have a given pattern so as to minimize shading loss. This may allow light to be introduced into the portion at which the second electrode layer 422 is not formed. The plan shape of the second electrode layer 422 will be described below in more detail with reference to FIG. 2.

The second electrode 44 may include a first electrode layer 441 and a second electrode layer 442, which are stacked over the second conductive area 30 in sequence. The role, material, shape and the like of the first and second electrode layers 441 and 442 of the second electrode 44 may be the same as the role, material, shape and the like of the first and second electrode layers 421 and 422 of the first electrode 42 except for the fact that the second electrode 44 is located on the second conductive area 30, and therefore the description related to the first electrode 42 may be equally applied to the second electrode 44.

In addition, various layers, such as, for example, an anti-reflection film and a reflection film, may be disposed on the first electrode layers 421 and 441 of the first and second electrodes 42 and 44.

At this time, in the first and second electrodes 42 and 44 of in the present embodiment, the second electrode layers 422 and 442 may be formed of a material that may be fired by low-temperature firing (e.g. firing at a processing temperature of 300° C. or less). In one example, the second electrode layers 422 and 442 may not include (or lack) a glass frit, but may include only a conductive material and a resin (e.g. a binder, a curing agent, or an additive). This serves to allow the second electrode layers 422 and 442 having no glass frit to be easily fired at a low temperature. The conductive material may include, for example, silver (Ag), aluminum (Al), or copper (Cu), and the resin may include, for example, a cellulose-based or phenolic-based binder, or an amine-based curing agent.

As described above, in the present embodiment, because the second electrode layers 422 and 442 need to be formed in contact with the first electrode layers 421 and 441, a fire-through that penetrates, for example, an insulation film is not required. Accordingly, low-temperature firing paste, from which the glass frit is removed, is used. Because the second electrode layers 422 and 442 include only the resin without the glass frit, the conductive material may be subjected to sintering so as to be brought into contact with the first conductive layers 421 and 441 without being connected thereto, thereby achieving conductivity via aggregation. This conductivity may be low. In consideration of this, in the present embodiment, the post-treatment operation ST50 may be performed in order to enhance conductivity. This will be described below in more detail with regard to the manufacturing method or the post-treatment method of the solar cell 100.

The plan shape of the second electrode layers 422 and 442 of the first and second electrodes 42 and 44 will be described below in more detail with reference to FIG. 2.

Figure 2:
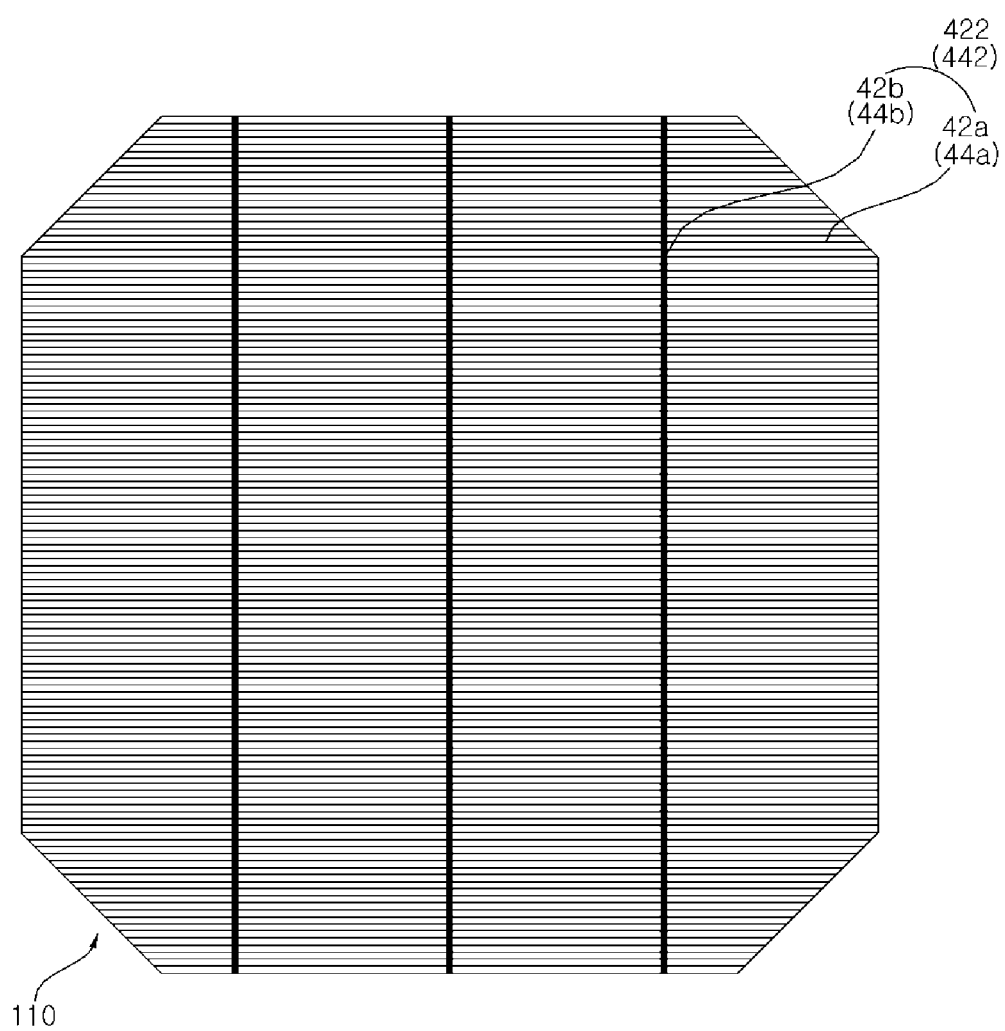
FIG. 2 is a plan view of a second electrode layer in the solar cell illustrated in FIG. 1.

FIG. 2 is a plan view of the second electrode layers 422 and 442 in the solar cell 100 illustrated in FIG. 1. The illustration of FIG. 2 is focused on the second electrode layers 422 and 442 of the first and second electrodes 42 and 44.

Referring to FIG. 2, the first and second electrode layers 422 and 442 may include a plurality of finger electrodes 42a and 44a spaced apart from one another at a constant pitch. While FIG. 2 illustrates that the finger electrodes 42a and 44a are parallel to one another and are parallel to the edge of the semiconductor substrate 110, the embodiments of the present invention are not limited thereto. In addition, the second electrode layers 422 and 442 may include bus-bar electrodes 42b and 44b, which are formed in a direction crossing the finger electrodes 42a and 44a so as to interconnect the finger electrodes 42a and 44a. Only one bus-bar electrode 42b or 44b may be provided, or a plurality of bus-bar electrodes 42b or 44b may be arranged at a larger pitch than the pitch of the finger electrodes 42a and 44a as illustrated in FIG. 2. At this time, although the width of the bus-bar electrodes 42b and 44b may be larger than the width of the finger electrodes 42a and 44a, the embodiments of the present invention are not limited thereto. Accordingly, the width of the bus-bar electrodes 42b and 44b may be equal to or less than the width of the finger electrodes 42a and 44a.

FIG. 2 illustrates that the second electrode layers 422 and 442 of the first electrode 42 and the second electrode 44 may have the same plan shape. However, the embodiments of the present invention are not limited thereto, and the width, pitch and the like of the finger electrodes 42a and the bus-bar electrodes 42b of the first electrode 42 may be different from the width, pitch and the like of the finger electrodes 44a and the bus-bar electrodes 44b of the second electrode 44. In addition, the second electrode layers 422 and 442 of the first electrode 42 and the second electrode 44 may have different plan shapes, and various other alterations are possible.

As such, in the present embodiment, in the first and second electrodes 42 and 44 of the solar cell 100, the second electrode layers 422 and 442, which are opaque or comprises a metal, may have a predetermined pattern so that the solar cell 100 has a bi-facial structure to allow light to be introduced into the front surface and the back surface of the semiconductor substrate 110. Thereby, the quantity of light used in the solar cell 100 may be increased, which may contribute to enhancement in the efficiency of the solar cell 100. However, the embodiments of the present invention are not limited thereto, and the second electrode layer 442 of the second electrode 44 may be formed at the entire back surface of the semiconductor substrate 110.

As described above, the solar cell 100, which has the photoelectric converter including the amorphous semiconductor layer, may be subjected to post-treatment, so as to prevent deterioration of the amorphous semiconductor layers and to enhance the conductivity of the electrodes 42 and 44. This will be described below in more detail with regard to the manufacturing method of the solar cell 100.

Figure 3:
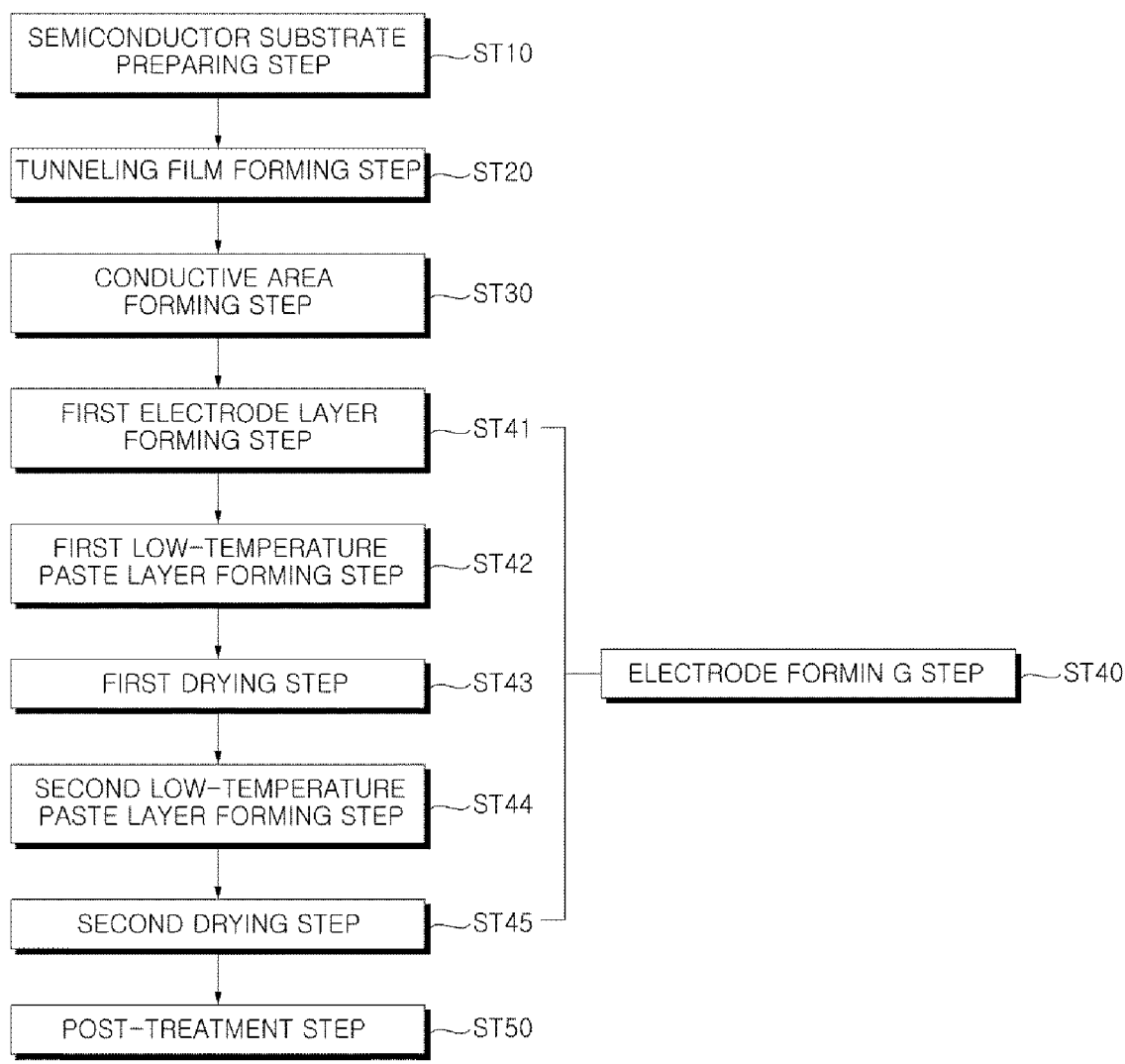
FIG. 3 is a flowchart illustrating a method of manufacturing a solar cell according to an embodiment of the present invention.

FIG. 3 is a flowchart illustrating the manufacturing method of the solar cell according to an embodiment of the present invention, and FIGS. 4A to 4I are sectional views illustrating the manufacturing method of the solar cell illustrated in FIG. 3. Hereinafter, a detailed description related to the configurations of the solar cell 100 described above with reference to FIGS. 1 and 2 will be omitted, and only configurations not described above will be described in detail.

Referring to FIG. 3, the manufacturing method of the solar cell 100 according to the present embodiment includes a semiconductor substrate preparing operation ST10, a tunneling film forming operation ST20, a conductive area forming operation ST30, an electrode forming operation ST40, and a post-treatment operation T50. The electrode forming operation ST40 includes a first electrode layer forming operation ST41, a first low-temperature paste layer forming operation ST42, a first drying operation ST43, a second low-temperature paste layer forming operation ST44, and a second drying operation ST45, This will be described below in detail with reference to FIGS. 4A to 4I.

Figure 4A:
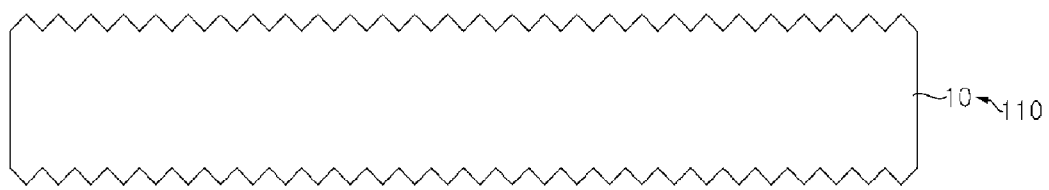
FIGS. 4A to 4I are sectional views illustrating the method of manufacturing the solar cell illustrated in FIG. 3.

First, as illustrated in FIG. 4A, in the semiconductor substrate preparing operation ST10, the semiconductor substrate 110 including the base area 10 is prepared.

Figure 4B:
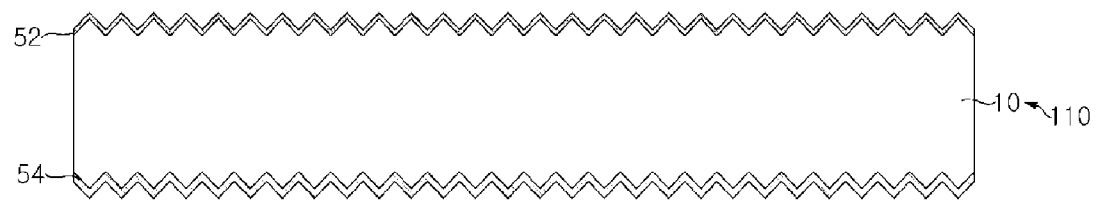

Subsequently, as illustrated in FIG. 4B, in the tunneling film forming operation ST20, the tunneling films 52 and 54 are formed over the entire surface of the semiconductor substrate 110. More specifically, the first tunneling film 52 is formed on the front surface of the semiconductor substrate 110, and the second tunneling film 54 is formed on the back surface of the semiconductor substrate 110. Although the tunneling films 52 and 54 are illustrated in FIG. 4B as being not formed on the side surface of the semiconductor substrate 110, the tunneling films 52 and 54 may also be formed on the side surface of the semiconductor substrate 110.

The tunneling films 52 and 54 may be formed via, for example, thermal growth or deposition (e.g. plasma enhanced chemical vapor deposition (PECVD) or atomic layer deposition (ALD)). However, the embodiments of the present invention are not limited thereto, and the tunneling films 52 and 54 may be formed via various other methods.

Figure 4C:
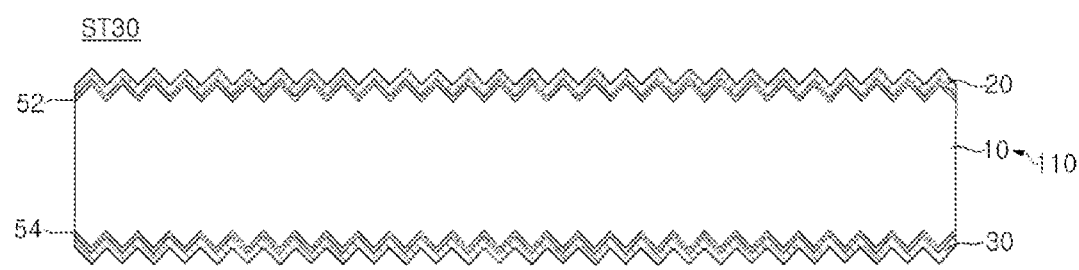

Subsequently, as illustrated in FIG. 4C, in the conductive area forming operation ST30, the conductive areas 20 and 30 are formed on the tunneling films 52 and 54. More specifically, the first conductive area 20 may be formed on the first tunneling film 52, and the second conductive area 30 may be formed on the second tunneling film 54.

The conductive areas 20 and 30 may be formed via, for example, deposition (e.g. PECVD or low pressure chemical vapor deposition (LPCVD)). A first conductive dopant or a second conductive dopant may be introduced to a semiconductor layer, which forms the conductive area 20 or 30, in the growth process of the semiconductor layer, or may be doped after the semiconductor layer is formed, via, for example, ion-implantation, thermal diffusion, or laser doping. However, the embodiments of the present invention are not limited thereto, and the conductive areas 20 and 30 may be formed via various other methods.

Figure 4D:
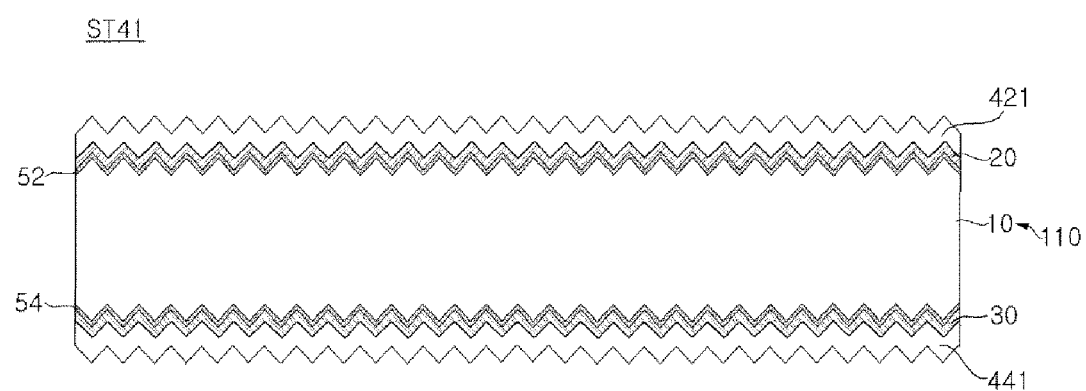

Subsequently, as illustrated in FIG. 4D, in the first electrode layer forming operation ST41, the first electrode layers 421 and 441 are formed respectively on the conductive areas 20 and 30. More specifically, the first electrode layer 421 of the first electrode 42 may be formed on the first conductive area 20, and the first electrode layer 441 of the second electrode 44 may be formed on the second conductive area 30.

The first electrode layers 421 and 441 may be formed via, for example, deposition (e.g. PECVD or coating). However, the embodiments of the present invention are not limited thereto, and the first electrode layers 421 and 441 may be formed via various other methods.

Figure 4E:
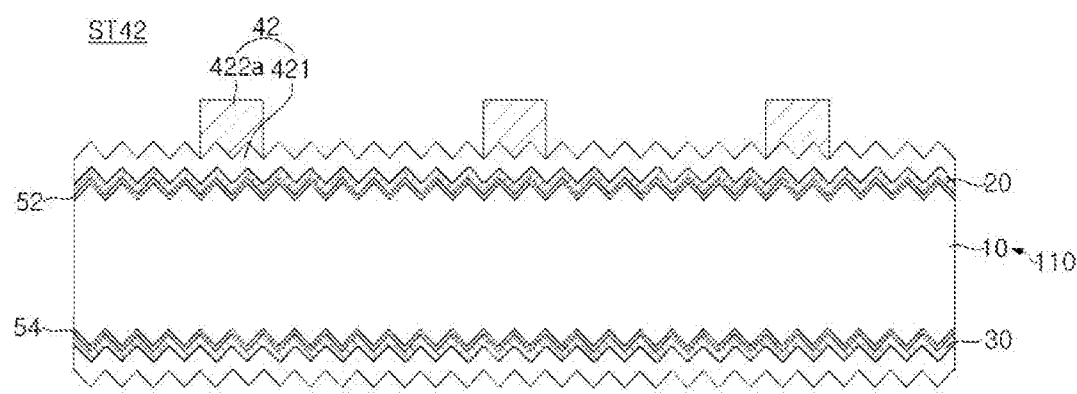

Subsequently, as illustrated in FIG. 4E, in the first low-temperature paste layer forming operation ST42, a first low-temperature paste layer 422a is formed on one of the conductive areas 20 and 30 (the first conductive area 20 in FIG. 4E). The first low-temperature paste layer 422a may include a conductive material, a resin (e.g. a binder, a curing agent, and an additive), and a solvent. The constituent materials of the conductive material and the resin have already been described, and thus a description thereof is omitted here. The solvent may be any of various materials, and for example, may be an ether-based solvent. At this time, with respect to 100 wt % of the first low-temperature paste layer 422a, the conductive material may be included in an amount of 85 wt % to 90 wt %, the resin may be included in an amount of 1 wt % to 15 wt %, and the solvent may be included in an amount of 5 wt % to 10 wt %. However, the embodiments of the present invention are not limited thereto.

The first low-temperature paste layer 422a may be formed via various methods. In one example, the first low-temperature paste layer 422a may be formed to have a desired pattern via printing. As such, the first low-temperature paste layer 422a may be formed into a desired pattern via a simplified process. Meanwhile, the first low-temperature paste layer 422a may have a single layer structure as illustrated, or may have a multi-layered structure unlike the illustration.

Figure 4F:
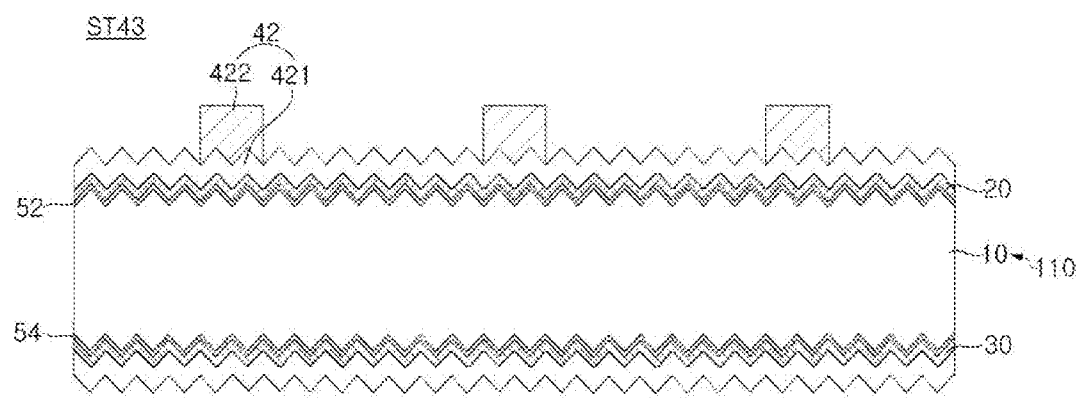

Subsequently, as illustrated in FIG. 4F, in the first drying operation ST43, the first low-temperature paste layer 422a is dried so that one of the second electrode layers 422 and 442 (the second electrode layer 422 of the first electrode 42 in FIG. 4F) is formed. The first drying operation ST43 may be performed at a temperature of 300° C. or less. This temperature is limited to a low temperature at which deterioration of the tunneling films 52 and 54 and the conductive areas 20 and 30 may be prevented. However, the embodiments of the present invention are not limited thereto.

When the solvent of the first low-temperature paste layer 422a is volatilized in the first drying operation ST43, one of the second electrode layers 422 and 442 (the second electrode layer 422 of the first electrode 42 in FIG. 4F) includes the conductive material and the resin.

Figure 4G:
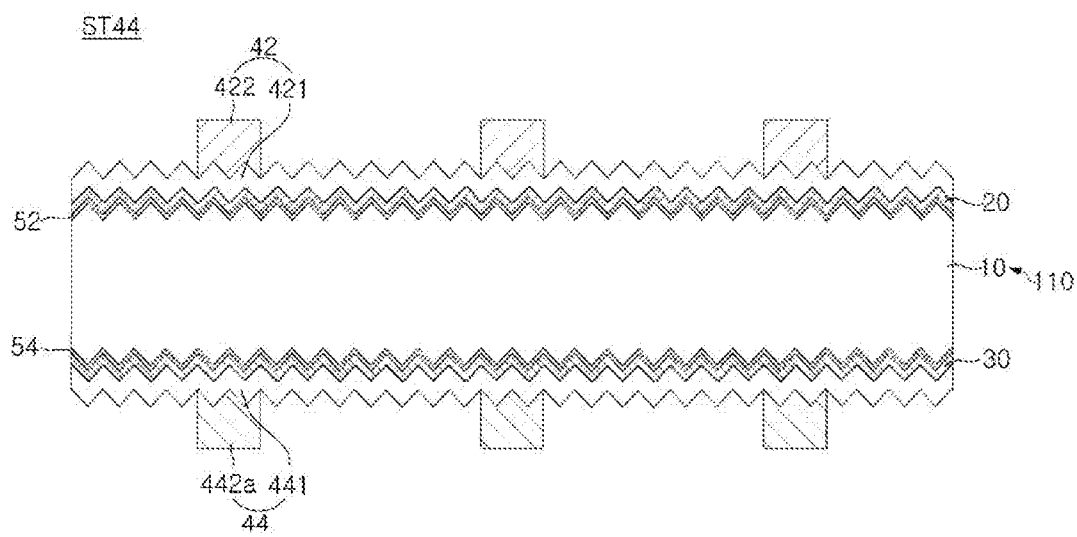

Subsequently, as illustrated in FIG. 4G, in the second low-temperature paste layer forming operation ST44, a second low-temperature paste layer 442a is formed on the other one of the conductive areas 20 and 30 (the second conductive area 30 in FIG. 4G). The second low-temperature paste layer 442a may include a conductive material, a binder, and a solvent. The second low-temperature paste layer 442a may include, for example, the same or similar material or composition as the first low-temperature paste layer 422a, and thus a detailed description thereof is omitted here.

The second low-temperature paste layer 442a may be formed via various methods. In one example, the second low-temperature paste layer 442a may be formed to have a desired pattern via printing. As such, the second low-temperature paste layer 442a may be formed into a desired pattern via a simplified process.

Figure 4H:
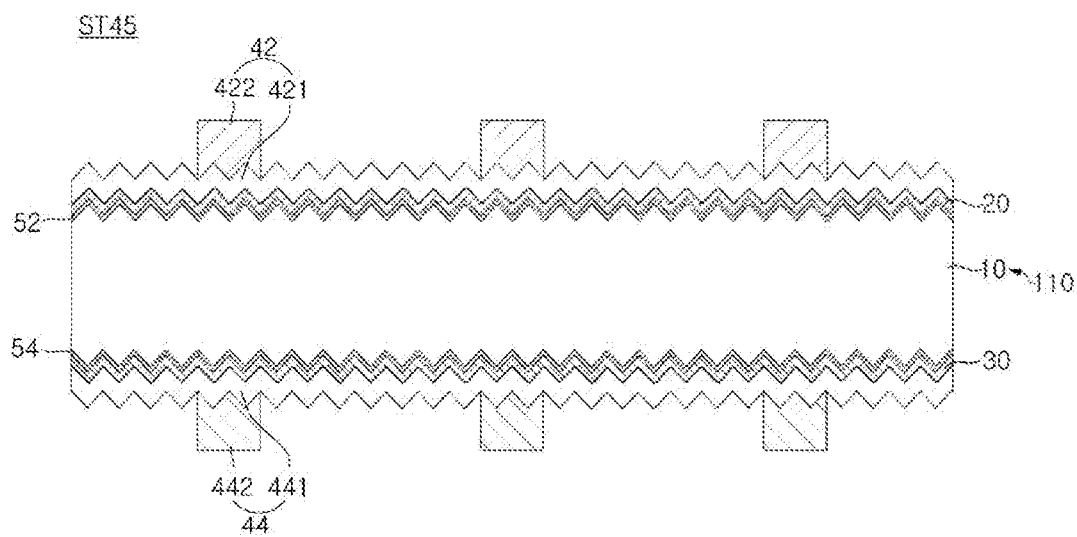

Subsequently, as illustrated in FIG. 4H, in the second drying operation ST45, the second low-temperature paste layer 442a is dried so that the other one of the second electrode layers 422 and 442 (the second electrode layer 442 of the second electrode 44 in FIG. 4H) is formed. The second drying operation ST45 may be performed at the temperature of 300° C. or less. This temperature is limited to a low temperature at which deterioration of the tunneling films 52 and 54 and the conductive areas 20 and 30 may be prevented. However, the embodiments of the present invention are not limited thereto.

When the solvent of the second low-temperature paste layer 442a is volatilized in the second drying operation ST45, the other one of the second electrode layers 422 and 442 (the second electrode layer 442 of the second electrode 44 in FIG. 4H) includes the conductive material and the resin, without including a metal compound, which includes, for example, oxygen, carbon, and sulfur.

In the drawings and the above description, after the first low-temperature paste layer 422a is formed and dried, the second low-temperature paste layer 442a is formed and dried. It may be difficult to form the first and second low-temperature paste layers 422a and 442a, which are in a liquid state, on opposite surfaces such that they both have the desired pattern at the same time. In consideration of this, in the state in which one of the second electrode layers 422 and 442 has been formed by forming and drying the first low-temperature paste layer 422a, which is in a liquid state, the second low-temperature paste layer 442a, which is in a liquid state, is formed on the opposite surface. Thereby, it is possible to prevent, for example, the first low-temperature paste layer 422a from flowing down while the second low-temperature paste layer 442a is formed. However, the embodiments of the present invention are not limited thereto, and the first and second low-temperature paste layers 422a and 442a may be formed on opposite sides at the same time, and thereafter may be dried together.

In the drawings and the above description, after the first low-temperature paste layer 422a has been formed and dried on the first conductive area 20, which is disposed on the front surface of the semiconductor substrate 110, the second electrode layer 422 of the first electrode 42 is formed. Thereafter, after the second low-temperature paste layer 442a has been formed and dried on the second conductive area 30, which is disposed on the back surface of the semiconductor substrate 110, the second electrode layer 442 of the second electrode 44 is formed. However, this sequence is given only by way of example, and the embodiments of the present invention are not limited thereto. After the first low-temperature paste layer 422a has been formed and dried on the second conductive area 30, which is disposed on the back surface of the semiconductor substrate 110, the second electrode layer 442 of the second electrode 44 may be formed. At this time, the second low-temperature paste layer 442a, which is formed after the first low-temperature paste layer 422a, may be formed and dried on the first conductive area 20, which is disposed on the front surface of the semiconductor substrate 110, so as to form the second electrode layer 422 of the first electrode 42.

Figure 4I:
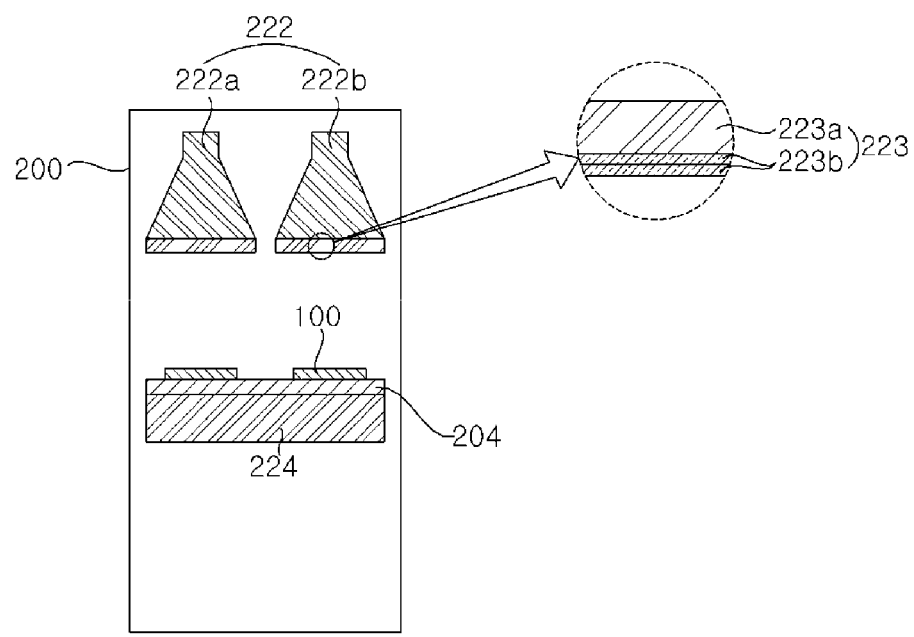

Subsequently, as illustrated in FIG. 4I, the post-treatment operation ST50 for providing the solar cell 100 with light is performed. At this time, when heat is also provided to the solar cell 100, the effect of the post-treatment operation ST50 may be further improved. Meanwhile, in the present embodiment, the post-treatment operation ST50 may be a two-operation post-treatment. This will be described later.

When light is provided to the solar cell 100 in the post-treatment operation ST50, the mobility of hydrogen is improved and the diffusion rate of hydrogen is increased. In the case where the tunneling films 52 and 54 and/or the conductive areas 20 and 30 are configured as amorphous semiconductor layers, a great amount of hydrogen is included therein. When the diffusion rate of hydrogen is increased, hydrogen may easily diffuse to the interfaces therebetween. Thereby, the amount of hydrogen inside the amorphous semiconductor layers may be greatly reduced, and the incidence of defects in the interfaces may be reduced.

In this way, it is possible to prevent deterioration of the amorphous semiconductor layers, which may occur when the reactivity of hydrogen inside the amorphous semiconductor layers increases due to light or heat. Accordingly, the thermal stability of the solar cell 100 may be secured at a temperature of 200° C. or more. In one example, the solar cell 100, manufactured by the manufacturing method according to the present embodiment, may have thermal stability at a temperature of 300° C. or less. Thereby, deterioration of the amorphous semiconductor layers may be prevented in a subsequent module process, such as, for example, a process of attaching ribbons to the solar cell 100. In addition, reduction in the defects in the interfaces may improve passivation effects.

The method of manufacturing the solar cell according to the present invention may be performed at a relatively low temperature, i.e. a processing temperature of 300° C. or less. Thus, because the process of manufacturing the solar cell 100 is not performed at a high processing temperature (e.g. a temperature above 300° C.), deterioration of the semiconductor layers included in the solar cell 100 may be prevented during the manufacturing operations of the solar cell 100.

In addition, the conductivity of the electrodes 42 and 44 formed using the first and second low-temperature paste layers 422a and 442a may be enhanced by the light provided in the post-treatment operation ST50. It is expected that this is because light increases the activity of a binder included in the first and second low-temperature paste layers 422a and 442a, thus exerting light-sintering effects.

At this time, the light, provided to the solar cell 100 in the post-treatment operation ST50, may have luminous intensity with a range from 100 W/m$^2$ to 30000 W/m$^2$. When the luminous intensity is below 100 W/m$^2$, the effect of the post-treatment operation ST50 may be insufficient. On the other hand, it may be difficult to realize light having luminous intensity above 30000 W/m$^2$ using current light sources. In one example, the light provided to the solar cell 100 in the post-treatment operation ST50 may have luminous intensity within a range from 100 W/m$^2$ to 20000 W/m$^2$. Thereby, the effect of the post-treatment operation ST50 may be effectively improved.

In one example, the light provided to the solar cell 100 in the post-treatment operation ST50 may have a wavelength within a range from 300 nm to 1000 nm. Infrared light, having a wavelength above 1000 nm, may heat the solar cell 100 to an uncontrollable level. Therefore, in the present embodiment, the effect of the post-treatment operation ST50 of the solar cell 100 may be maximized using only light, which has a wavelength associated with only the post-treatment of the solar cell 100. In one example, the light provided to the solar cell 100 may have a wavelength within a range from 400 nm to 800 nm. When deterioration of the amorphous semiconductor layers is prevented using light having a wavelength that is directly involved in the photo-electric conversion of the solar cell 100, the effect of the post-treatment operation ST50 of the solar cell 100 may be maximized.

Meanwhile, the light, provided to the solar cell 100 in the post-treatment operation ST50, may have a wavelength of 400 nm or less, and specifically, may have a wavelength within a range from 300 nm to 400 nm. In this instance, the luminous intensity may range from 100 W/m$^2$ to 5000 W/m$^2$. In addition, the light provided to the solar cell 100 in the post-treatment operation ST50 may have a wavelength that exceeds 400 nm and is equal to or less than 1000 nm. In this case, the luminous intensity may range from 100 W/m$^2$ to 30000 W/m$^2$. This is because the light provided to the solar cell 100 has different energies depending on the wavelength thereof, and thus the luminous intensity may vary to correspond to the wavelengths of light.

Accordingly, because light having a wavelength of 400 nm or less has high energy, the effect may be maximized by providing lower luminous intensity than light having a wavelength above 400 nm. As such, the light provided to the solar cell 100 in the post-treatment operation ST50 may facilitate the firing of the first and second low-temperature paste layers 422a and 442a at a wavelength and luminous intensity within the above-described ranges, and may prevent deterioration of the amorphous semiconductor layers by light owing to the increased mobility of hydrogen. In the present embodiment, the post-treatment operation ST50 may be performed at room temperature or in the state in which heat is applied. In particular, the firing of the first and second low-temperature paste layers 422a and 442a may be facilitated when heat and light are provided together in the post-treatment operation ST50. In addition, when the mobility of hydrogen is improved, deterioration of the amorphous semiconductor layers by light may be prevented. In one example, the processing temperature in the post-treatment operation ST50 may be room temperature or 300° C. (e.g. within a range from 15° C. to 300° C.). In this instance, the processing temperature may mean the temperature of the solar cell 100 (or the semiconductor substrate 110) on which the post-treatment operation ST50 is performed. When the processing temperature is lower than room temperature, the effect of the post-treatment operation ST50 may be reduced and an additional device may be required in order to realize a temperature that is lower than room temperature. When the processing temperature exceeds 300° C., the amorphous semiconductor layers may be deteriorated while the post-treatment operation ST50 is performed, prior to realizing the effect of the post-treatment operation ST50. In one example, the processing temperature in the post-treatment operation ST50 may range from 100° C. to 300° C. This is because the effect of the post-treatment operation ST50 may be further enhanced when the processing temperature is 100° C. or more.

Figure 5:
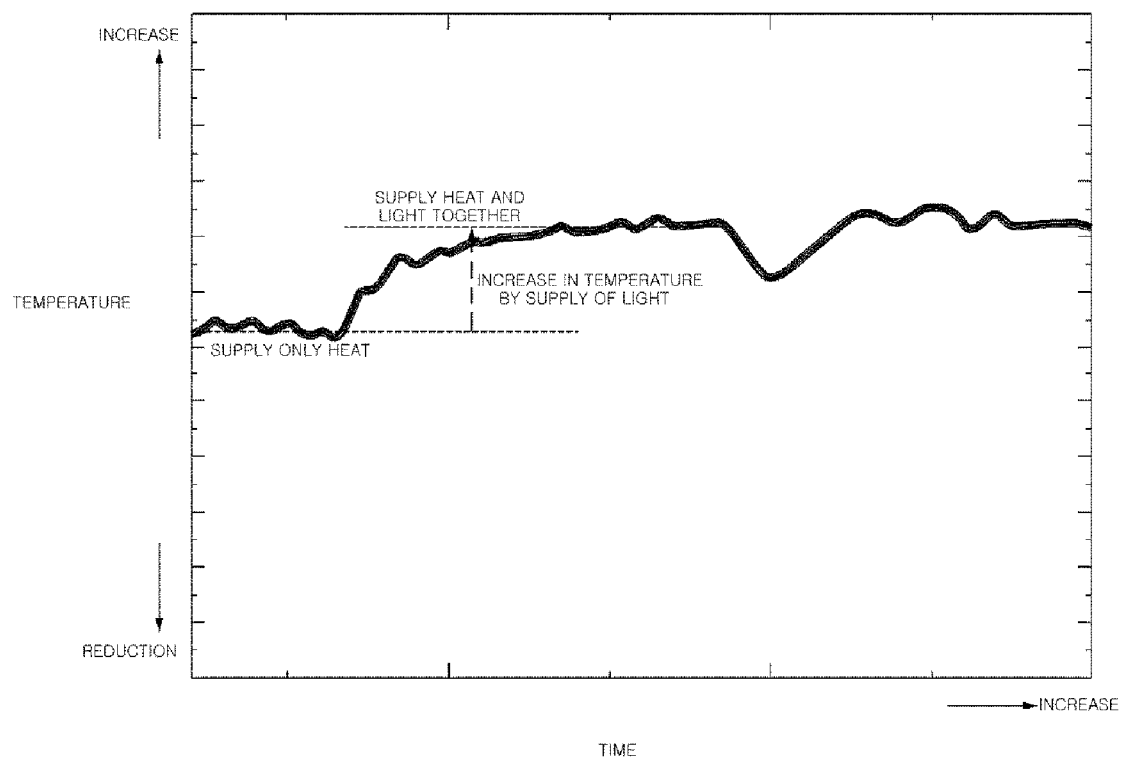
FIG. 5 is a view illustrating the results of measuring the temperature of the solar cell (or a semiconductor substrate) in two respective cases in which only heat is applied and in which heat and light are applied together, in a post-treatment operation of the method of manufacturing the solar cell illustrated in FIG. 3.

At this time, in the present embodiment, the processing temperature in the post-treatment operation ST50 may range from 200° C. to 300° C. This is because, as described above, according to the present invention, the light applied in the post-treatment operation ST50 may prevent deterioration of the amorphous semiconductor layers in the solar cell 100, and thus the thermal stability of the solar cell 100 may be secured at a temperature of 200° C. or more. As such, the post-treatment operation ST50 may be performed at a relatively high processing temperature within a range from 200° C. to 300° C. This may minimize the resistance of the amorphous semiconductor layers and may greatly enhance the specific resistance of the electrodes 42 and 44. In addition, in the present embodiment, the temperature of the solar cell 100, i.e. the processing temperature in the post-treatment operation ST50, may be effectively increased by light. That is, when heat and light are used together, as illustrated in FIG. 5, the temperature of the solar cell 100 may be increased by the light. Thereby, the amount of heat to be supplied to the solar cell 100 via a heat source may be reduced, which may reduce manufacturing costs. In addition, considering the fact that it may be difficult to precisely control the temperature of the solar cell 100 using the heat applied from the heat source, when light is emitted in the state in which the temperature of the solar cell 100 is made by the heat source to fall within an approximate temperature range, the temperature of the solar cell 100 may be precisely controlled to and stably maintained within the desired range.

In the present embodiment, the post-treatment operation ST50 may be performed by introducing the solar cell 100 into a post-treatment apparatus 200, which is maintained at the above-described processing temperature and provides light, without a separate preheating process. This is because the processing temperature is not high, and thus at the processing temperature there is a low likelihood that, for example, the properties of the solar cell 100 will be deteriorated due to rapid variation in temperature. As such, a preheating process and a facility for the same may be eliminated, which may increase productivity.

The processing time of the post-treatment operation ST50 may range from 30 seconds to 1 hour. When the processing time is below 30 seconds, the effect of the post-treatment operation ST50 may be insufficient. When the processing time exceeds 1 hour, the processing time is excessively long, thus causing reduced productivity. In one example, the processing time of the post-treatment operation ST50 may range from 1 minute to 30 minutes. As such, the effect of the post-treatment operation ST50 may be stably realized and high productivity may be maintained.

In one example, the solar cell 100 may be subjected to post-treatment within the post-treatment apparatus 200, which includes a light source unit 222 for providing the solar cell 100 with light. At this time, the post-treatment apparatus 200 may be a heat-treatment apparatus, which further includes a heat source unit 224.

The light source unit 222 serves to provide the solar cell 100 with light having desired luminous intensity. Because the luminous intensity of the light required in the post-treatment operation ST50 ranges from 100 W/m$^2$ to 30000 W/m$^2$, the light source unit 222 may provide light having luminous intensity within a range from 100 W/m$^2$ to 30000 W/m$^2$.

At this time, various methods of adjusting the luminous intensity of the light source unit 222 may be applied in order to provide light having luminous intensity required in the post-treatment operation ST50. That is, for example, the number, type, and output of light sources 222a and 222b, which constitute the light source unit 222, may be adjusted, or the distance between the light sources 222a and 222b and the solar cell 100 may be changed.

In the present embodiment, the light source unit 222 may include the multiple light sources 222a and 222b so as to provide the solar cell 100 with sufficient light. However, the embodiments of the present invention are not limited thereto, and only one of the light sources 222a and 222b may be provided when light having high luminous intensity is not required.

In the present embodiment, each of the light sources 222a and 222b may configure a Plasma Lighting System (PLS) that provides light via plasma light emission. In the plasma lighting system, electromagnetic waves, such as microwaves, or incident beams, generated by a magnetron, are applied to a particular gas charged inside a bulb so as to ionize the gas inside the bulb to a high degree (i.e. to generate plasma), thus causing light to be emitted from the plasma. The wavelength of the light emitted from the plasma lighting system may range from 300 nm to 1200 nm.

The plasma lighting system does not use an electrode, a filament, or mercury, which are constituent elements of a conventional lighting system, and thus is eco-friendly and has a semi-permanent lifespan. In addition, the plasma lighting system has a very excellent maintenance rate of super luminous flux, thus having low variation in the quantity of light even after it has been used for a long time. Because the plasma lighting system is highly resistant to heat and thus has excellent thermal stability, the plasma lighting system may be used along with the heat source unit 224 in the same space without any problems, and may emit light having sufficient luminous intensity. For reference, other light sources, such as, for example, light-emitting diodes, are vulnerable to heat, and thus have difficulty in being used along with the heat source unit 224, and emit only light having a low level of luminous intensity. In addition, the plasma lighting system may emit almost continuously uniform light across the entire wavelength band of visible light, and thus may provide light similar to solar light. At this time, in the present embodiment, the gas, which is charged inside the bulb of the plasma lighting system, may be an In—Br compound, which is produced by combining indium (In) and bromine (Br) with each other. Thereby, the resulting light may have a spectrum that is more similar to solar light than in the conventional case in which sulfur gas is used. When light having a similar spectrum to solar light is provided, the post-treatment operation ST50 may be performed under conditions similar to solar light. Thereby, for example, deterioration due to solar light may be effectively preemptively prevented in the post-treatment operation ST50.

The present embodiment illustrates that the use of multiple light sources 222a and 222b, which include the plasma lighting systems. As such, light having desired luminous intensity may be stably provided to the solar cell 100. However, the embodiments of the present invention are not limited thereto, and for example, xenon lamps, halogen lamps, lasers, or light-emitting diodes (LEDs) may be used as the light sources 222a and 222b. That is, the light sources 222a and 222b may be at least one of xenon lamps, halogen lamps, lasers, plasma lighting systems, and light-emitting diodes (LEDs).

Meanwhile, UV lamps for emitting ultraviolet light may be used as the light sources 222a and 222b. In this instance, the UV lamps may emit light having a wavelength within a range from 300 nm to 400 nm. However, the embodiments of the present invention are not limited thereto, and the UV lamp may emit extreme ultraviolet light having a wavelength below 300 nm.

In the present embodiment, a cover substrate 223, which is located on the front surface (i.e. the light-emitting surface) of each of the light sources 222a and 222b, may include a base substrate 223a, and a plurality of layers 223b, which are disposed on the base substrate 223a and have different indices of refraction.

The base substrate 223a may be formed of a material that has strength capable of protecting the light sources 222a and 222b and has transmittance for enabling the transmission of light. For example, the base substrate 223a may be formed of glass.

The layers 223b may be formed by stacking layers having different indices of refraction one above another, and may serve as a filter for blocking undesired light. For example, the layers 223b may be formed of oxide-based materials having different indices of refraction, and may block light having a wavelength that is below 300 nm (e.g. below 600 nm) and exceeds 1200 nm (e.g. exceeds 1000 nm). The constituent materials and the stacking structure of the layers 223b may be selected from among various materials and various stacking structures, which may block light having a wavelength that is below 300 nm (e.g. below 600 nm) and exceeds 1200 nm (e.g. exceeds 1000 nm).

Although FIG. 4I illustrates that the layers 223b are located on the outer surface of the base substrate 223a, the embodiments of the present invention are not limited thereto. Thus, the layers 223b may be located on the inner surface of the base substrate 223a, or may be located on the inner and outer surfaces of the base substrate 223a.

In the present embodiment, as a result of the cover substrate 223 of the light source 222a or 222b blocking some of the light, an amount of light that is sufficient for the post-treatment operation ST50 may be provided to the solar cell 100. As such, the effect of the post-treatment operation ST50 may be maximized while having a simplified structure. However, the embodiments of the present invention are not limited thereto, and for example, an optical filter installed between the light sources 222a and 222b and the solar cell 100 may be used to block some of the light, in addition to the cover plate 223 of the light sources 222a and 222b.

The heat source unit 224 provides appropriate heat to allow the solar cell 100 to have a desired temperature in the post-treatment apparatus 200. At this time, the heat source unit 224 may employ various types, structures, and shapes.

In one example, heat sources, which constitute the heat source unit 224, may be ultraviolet lamps, and for example, may be halogen lamps. Alternatively, for example, coil heaters may be used as the heat sources. When the heat sources use ultraviolet lamps, such as, for example, halogen lamps, the temperature may be rapidly increased compared to the case where coil heaters are used. When the heat sources include coil heaters, facility costs may be reduced.

In the present embodiment, the heat source unit 224 may be spaced apart from the solar cell 100, or from a conveyor belt or a working table 204 on which the solar cell 100 is placed, and may heat the solar cell 100 via an atmospheric heating method that heats the atmosphere of a main area by radiation. Thereby, damage to the solar cell 100 by the heat source unit 224 or problems, such as, for example, excessive heat emission to local portions of the solar cell 100 may be minimized. For example, when the heat sources of the heat source unit 224 are ultraviolet lamps, the passivation properties of the passivation films 22 and 32 may be deteriorated when ultraviolet light is directly radiated thereon. In addition, when the heat sources of the heat source unit 224 come into contact with the solar cell 100 and thus cause, for example, process errors, the solar cell 100 may be locally heated, which may cause problems, such as, for example, heating of a portion of the solar cell 100 to an undesired temperature. However, the embodiments of the present invention are not limited thereto, and the solar cell 100 may be heated by, for example, conduction, instead of the atmospheric heating method.

As described above, in the post-treatment operation ST50, light may be provided by the light source unit 222, and a constant temperature may be maintained by the heat source unit 224. At this time, in the present embodiment, heat and light are provided to the solar cell 100 by the light source unit 222 and the heat source unit 224, which are spaced apart from each other. That is, the light sources 222a and 222b, which constitute the light source unit 222, may be located together, and the light sources 222a and 222b of the light source unit 222 are not interspersed with the heat source unit 224. In this state, the light source unit 222 and the heat source unit 224 are adapted to separately provide the solar cell 100 with light and heat, which may minimize the effect of the light source unit 222 and the heat source unit 224 on each other.

In one example, the light source unit 222 may be located on one side of the solar cell 100 and the heat source unit 224 may be located on the other side of the solar cell 100 in the main area. As such, light and heat from the light source unit 222 and the heat source unit 224 may be effectively transferred to the solar cell 100, and interference therebetween may be minimized.

For example, the light source unit 222 may be located at the upper side of the solar cell 100 (i.e. above the conveyor belt or the working table 204), and the heat source unit 224 may be located at the lower side of the solar cell 100 (i.e. beneath the conveyor belt or the working table 204). When the light source unit 222 is located at the lower side of the conveyor belt or the working table 204, some of the light provided from the light source unit 222 may be blocked by the conveyor belt or the working table 204, which may prevent the effective radiation of light. In contrast, the heat source unit 224 may provide the solar cell 100 with sufficient heat via atmospheric heating or conduction even if it is located at the lower side of the conveyor belt or the working table 204. Accordingly, in the present embodiment, the light source unit 222 may be located at the upper side of the solar cell 100, or above the conveyor belt or the working table 204, and the heat source unit 224 may be located at the lower side of the solar cell 100, or beneath the conveyor belt or the working table 204. However, the embodiments of the present invention are not limited thereto, and the exact positions of the light source unit 222 and the heat source unit 224 may be changed.

In the present embodiment, the solar cell 100 may be subjected to post-treatment in the post-treatment apparatus 200, which has an independent batch structure. As such, external interference may be minimized during processing, which may maximize processing effects and may enhance the uniformity of processing. In addition, a conveyor belt may be omitted, which may reduce the cost of facilities. The solar cell 100 may be subjected to post-treatment in the post-treatment apparatus 200 via an inline process using, for example, a conveyor belt. As such, the post-treatment of the solar cell 100 may be performed at a high speed, and the production of the solar cell 100 may be increased.

Figure 6:
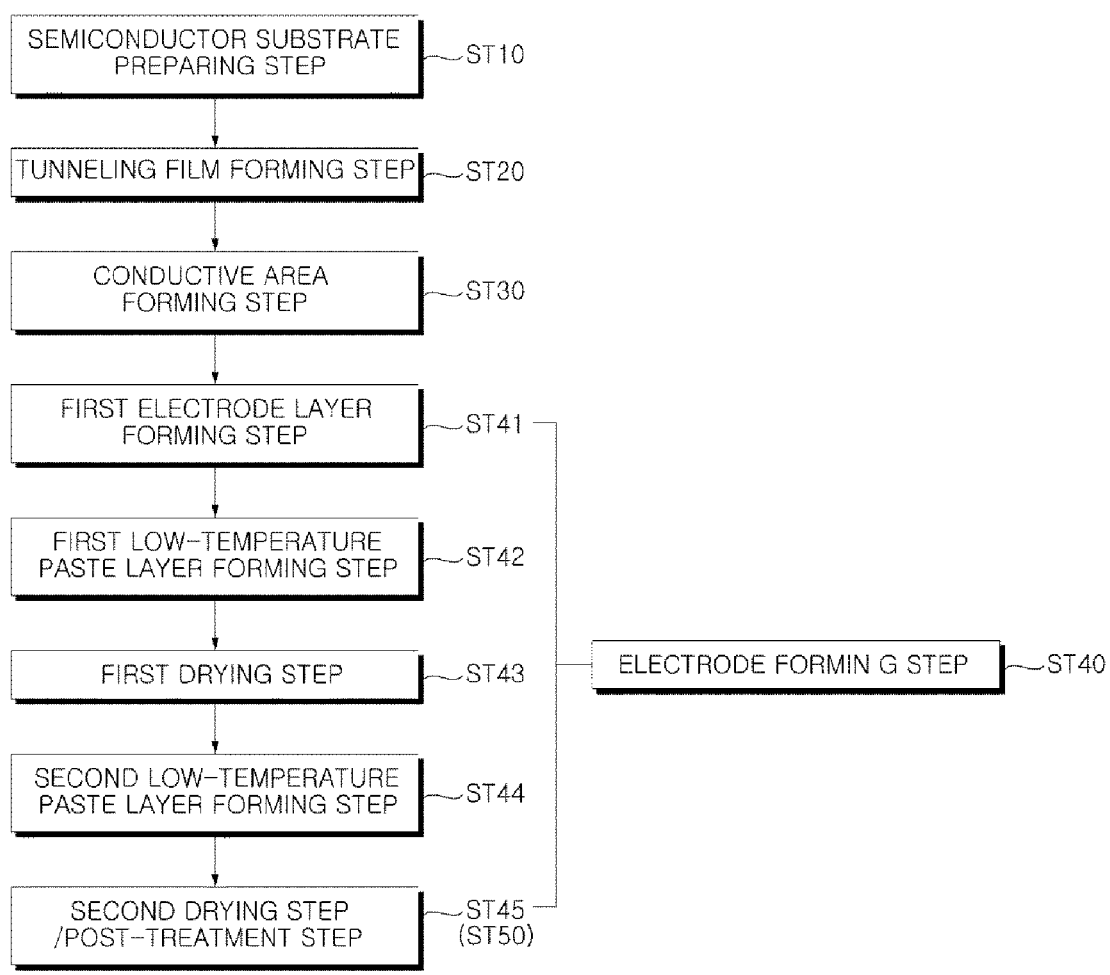
FIG. 6 is a flowchart illustrating a method of manufacturing a solar cell according to another embodiment of the present invention.

FIGS. 3 and 4A to 4I illustrate that the second drying operation ST45 and the post-treatment ST50 are performed in separate processes. However, the embodiments of the present invention are not limited thereto, and the second drying operation ST45 may be performed in the post-treatment apparatus 200, whereby the second drying operation ST45 and the post-treatment operation ST50 may be performed at the same time, as illustrated in FIG. 6. Thereby, the effect of the post-treatment operation ST50 may be realized through a simplified process without an additional process.

When heat treatment is again performed on the solar cell 100 at a high temperature after the post-treatment operation ST50, the effect of the post-treatment operation ST50 may be reduced or eliminated. Therefore, the post-treatment operation ST50 may be performed during the latter half of the method of manufacturing the solar cell 100, and may be performed simultaneously with or after the second drying operation ST45, which is performed at a relatively high temperature. This may prevent reduction or elimination of the effect of the post-treatment operation ST50.

Figure 4J:
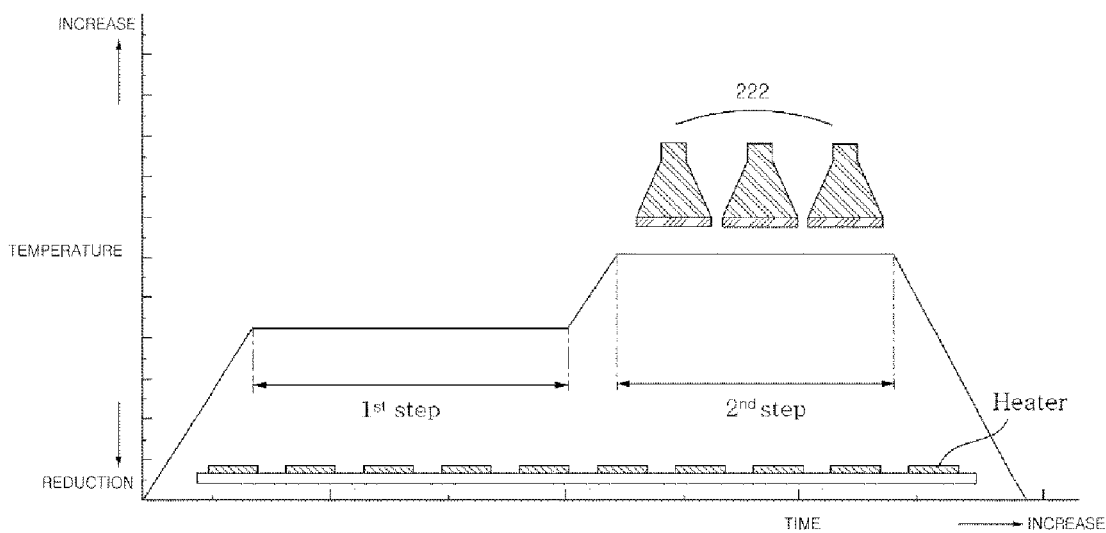
FIG. 4J is a diagram for explaining a post-treatment operation including two operations according to the present embodiment.

Meanwhile, in the present invention, the post-treatment operation ST50 may include two operations as described above. FIG. 4J is a diagram for explaining the post-treatment operation ST50 including two operations according to the present embodiment.

Considering FIG. 4J, the post-treatment operation ST50 may include a first operation 1st operation and a second operation 2nd operation. The first operation 1st operation may be an operation of supplying only heat via a heater, and the second operation 2nd operation may be an operation of supplying heat and light at the same time using the heater and the light source unit 222. Meanwhile, in the present embodiment, although the temperature of the second operation 2nd operation is illustrated as being higher than the temperature of the first operation 1st operation, the technical sprit of the embodiments of the present invention are not limited thereto. This illustration serves to explain that, when light and heat are supplied together in the second operation 2nd operation, the temperature range in which deterioration of the solar cell 100 does not occur in the post-treatment operation ST50 may be raised compared to the first operation 1st operation. Thus, the temperatures of the first operation 1st operation and the second operation 2nd operation may be the same.

Referring again to FIG. 4J, the first operation 1st operation may be performed at a temperature of 200° C. or less. When heat is provided to the solar cell 100, the mobility of hydrogen may be improved and the diffusion rate of hydrogen may be increased. That is, in the case where the tunneling films 52 and 54 and/or the conductive areas 20 and 30 are configured as amorphous semiconductor layers, a great amount of hydrogen is included therein. When the diffusion rate of hydrogen is increased, hydrogen may easily diffuse to the interfaces therebetween. Thereby, the amount of hydrogen inside the amorphous semiconductor layers may be greatly reduced, and the incidence of defects in the interfaces may be reduced.

Subsequently, in the second operation 2nd operation, light is additionally supplied using the light source unit 222. When heat and light are provided together to the solar cell 100 in the second operation 2nd operation, the mobility of hydrogen may be improved compared to that in the first operation 1st operation, causing the diffusion rate of hydrogen to be increased. In addition, the conductivity of the electrodes 42 and 44 formed using the first and second low-temperature paste layers 422a and 442a may be enhanced. It is expected that this is because light increases the activity of a binder included in the first and second low-temperature paste layers 422a and 442a, thus exerting light-sintering effects. The light supplied in the second operation 2nd operation may be substantially the same as that described above with reference to FIG. 4I.

In the present embodiment, the first operation 1st operation and the second operation 2nd operation may be successively performed using a conveyor belt on which the solar cell 100 is placed, without limitation thereto, and may be separately performed.

In the present embodiment, in the second operation 2nd operation, the temperature at which the solar cell 100 is deteriorated may be raised because light is supplied. In the manufacture of the solar cell 100, when the solar cell 100 includes an amorphous semiconductor layer and the processing temperature of the post-treatment operation ST50 exceeds 200° C., the amorphous semiconductor layer may be deteriorated. However, when the processing temperature is low, the diffusion rate of hydrogen may be reduced.

Therefore, the post-treatment operation ST50 according to the present embodiment may raise the processing temperature to 200° C. or more using the second operation 2nd operation when the solar cell 100 includes an amorphous semiconductor layer. That is, deterioration of the solar cell 100 may be prevented and the diffusion rate of hydrogen may be increased by the second operation 2nd operation of the post-treatment operation ST50 according to the present embodiment.

As described above with reference to FIGS. 4I and 4J, in the method of manufacturing the solar cell 100 according to the present embodiment, light may be provided to the solar cell 100 in the post-treatment operation ST50, which may reduce the amount of hydrogen included in amorphous semiconductor layers and may reduce the incidence of defects in interfaces of the amorphous semiconductor layers. At this time, when heat is also provided, the aforementioned effects may be further enhanced. Thereby, deterioration of the amorphous semiconductor layers may be effectively prevented. In one example, the solar cell 100, manufactured by the method of the present embodiment, may acquire thermal stability at a temperature of 300° C. or less. On the other hand, when the post-treatment operation ST50 is not performed on the solar cell 100, the solar cell 100 may have very low thermal stability at a temperature of 200° C. or more, and thus the amorphous semiconductor layers thereof may be easily deteriorated. In addition, the conductivity of the electrodes 42 and 44 may be enhanced. Thereby, for example, the density of charging of the solar cell 100 may be enhanced, resulting in enhanced efficiency of the solar cell 100.

The above-described embodiment illustrates that the post-treatment operation ST50 according to the present embodiment is performed on the solar cell 100, which includes, as a photoelectric converter, not only the semiconductor substrate 110, but also the amorphous semiconductor layers, i.e. the first and second tunneling films 52 and 54 and the first and second conductive areas 20 and 30. However, the embodiments of the present invention are not limited thereto. Thus, the post-treatment operation ST50 according to the present embodiment may be performed on the solar cell 100 that has any of various structures including the amorphous semiconductor layers.

Figure 7:
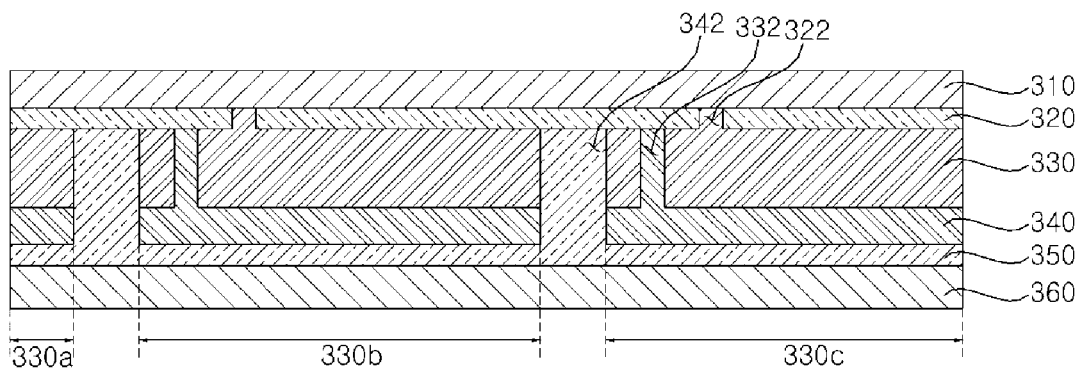
FIG. 7 is a sectional view illustrating another example of the solar cell, to which a post-treatment operation of the method of manufacturing the solar cell according to the embodiment of the present invention may be applied.

In one example, as illustrated in FIG. 7, the post-treatment operation ST50 according to the present embodiment may also be performed on a thin-film amorphous solar cell 300.

Referring to FIG. 7, the thin-film amorphous solar cell 300 according to the present embodiment includes a first substrate 310 (hereinafter referred to as a "front substrate"), and a first electrode 320, a photoelectric converter 330, and a second electrode 340, which are formed on the front substrate 310 (more specifically, on the lower surface of the front substrate 310 in FIG. 7). A sealing member 350 and a second substrate 360 (hereinafter referred to as a "back substrate") may further be formed on the second electrode 340. At this time, the photoelectric converter 330 includes a plurality of unit cells 330a, 330b and 330c, which are separated from one another by a first separator 322, a second separator 332, and a third separator 342, while being electrically connected to one another.

In one example, the front substrate 310 may be a transparent substrate formed of, for example, glass or polymers.

The first electrode 320 may be formed of a transparent conductive material, which has light transmittance and electrical conductivity. In one example, the first electrode 320 may be formed of a zinc oxide (ZnO), an indium tin oxide (ITO), or a tin oxide ($SnO_2$), or may be formed of a metal oxide and one or more foreign substances (dopant materials or impurities) (e.g. boron (B), fluorine (F), or aluminum (Al)) added thereto.

The photoelectric converter 330 may be an amorphous semiconductor layer, and may include a first conductive semiconductor layer (e.g. a first conductive silicon layer), an intrinsic semiconductor layer (e.g. an intrinsic silicon layer), and a second conductive layer (e.g. a second conductive silicon layer) so as to have a pin junction structure. Various known materials, structures, etc. may be applied to the first conductive semiconductor layer, the intrinsic semiconductor layer, and the second conductive semiconductor layer of the pin junction structure, and thus a description thereof is omitted here.

The second electrode 340 may be formed of a material (e.g. a metal material) that has reflectance and conductivity superior to those of the first electrode 320. In one example, the second electrode 340 may include a single layer or multiple layers formed of silver, aluminum, gold, nickel, chrome, titanium, palladium, or alloys thereof.

The sealing member 350 may be formed of ethylene-vinyl acetate (EVA), poly-vinyl butyral (PVB), silicone, an ester-based resin, or an olefin-based resin.

The back substrate 360 may take the form of a substrate, a film, or a sheet, and may be formed of, for example, glass or polymers.

In the method of manufacturing the thin-film amorphous solar cell 300 according to the present embodiment, the post-treatment operation ST50 may be performed after at least the first electrode 320, the photoelectric converter 330, and the second electrode 340 are formed on the front substrate 310. Thereby, deterioration in the properties of the photoelectric converter 330, which includes the amorphous semiconductor layers (e.g. the amorphous silicon layers), may be prevented, and the conductivity of the second electrode 340, which is connected to the photoelectric converter 330, may be enhanced.

Hereinafter, the present invention will be described in more detail with reference to experimental examples. The following experimental examples are suggested in order to describe the present invention in more detail, and the embodiments of the present invention are not limited thereto.

Experimental Example 1

A solar cell having the structure illustrated in FIG. 1 was manufactured by forming first and second tunneling films and first and second conductive areas, configured as amorphous silicon layers, on a crystalline silicon substrate, forming a first low-temperature paste layer and then performing a first drying operation, and forming a second low-temperature paste layer and then performing a second drying operation. At this time, the first and second low-temperature paste layers were formed of paste including 90 wt % silver (Ag), 5 wt % of a binder, and 5 wt % of a solvent.

Subsequently, a post-treatment operation was performed by providing each of a plurality of solar cells with light having luminous intensity of about 0 w/m² (or natural light without the provision of separate light), light having luminous intensity of about 800 w/m², and light having luminous intensity of 10000 w/m² for 20 minutes. At this time, the processing temperature was maintained at about 100° C. In this instance, it could be found from experimentation results that, assuming that the density of charging is 1 when the luminous intensity is 0 w/m², the relative value of the density of charging was about 1.03 when the luminous intensity was about 800 w/m², and the relative value of the density of charging was about 1.07 when the luminous intensity was about 10000 w/m².

That is, it can be appreciated that the density of charging when light is used in the post-treatment operation is higher than the density of charging when light is not used in the post-treatment operation.

Accordingly, it can be appreciated that the density of charging of the solar cell may be enhanced by the post-treatment operation in which light is supplied.

Experimental Example 2

A solar cell having the structure illustrated in FIG. 1 was manufactured in a plural number by forming first and second tunneling films and first and second conductive areas, configured as amorphous silicon layers, on a crystalline silicon substrate, forming a first low-temperature paste layer and then performing a second drying operation, and forming a second low-temperature paste layer and then performing a second drying operation. This is referred to as a solar cell according to Example 1.

A solar cell was manufactured in a plural number by forming first and second tunneling films and first and second conductive areas, configured as amorphous silicon layers, on a crystalline silicon substrate, forming a first low-temperature paste layer and then performing a first drying operation, and forming a second low-temperature paste layer, but performing no second drying operation illustrated in FIG. 4G. This is referred to as a solar cell according to Example 2.

At this time, the first and second low-temperature paste layers were formed of paste including 90 wt % silver (Ag), 5 wt % of a binder, and 5 wt % of a solvent.

Subsequently, a post-treatment operation was performed by providing the solar cells according to Example 1 and Example 2 with light having luminous intensity of about 2500 w/m² for 20 minutes. At this time, the post-treatment operation was performed on each of the solar cells according to Example 1 and the solar cells according to Example 2 at different processing temperatures of about 20° C. (a room temperature state in which no heat is separately supplied), about 50° C., about 110° C., about 200° C., about 300° C., about 400° C., and about 500° C. The densities of charging of the solar cells according to Example 1 and Example 2 were measured after the post-treatment operation was performed, and the relative values thereof are illustrated in FIG. 8.

Figure 8:
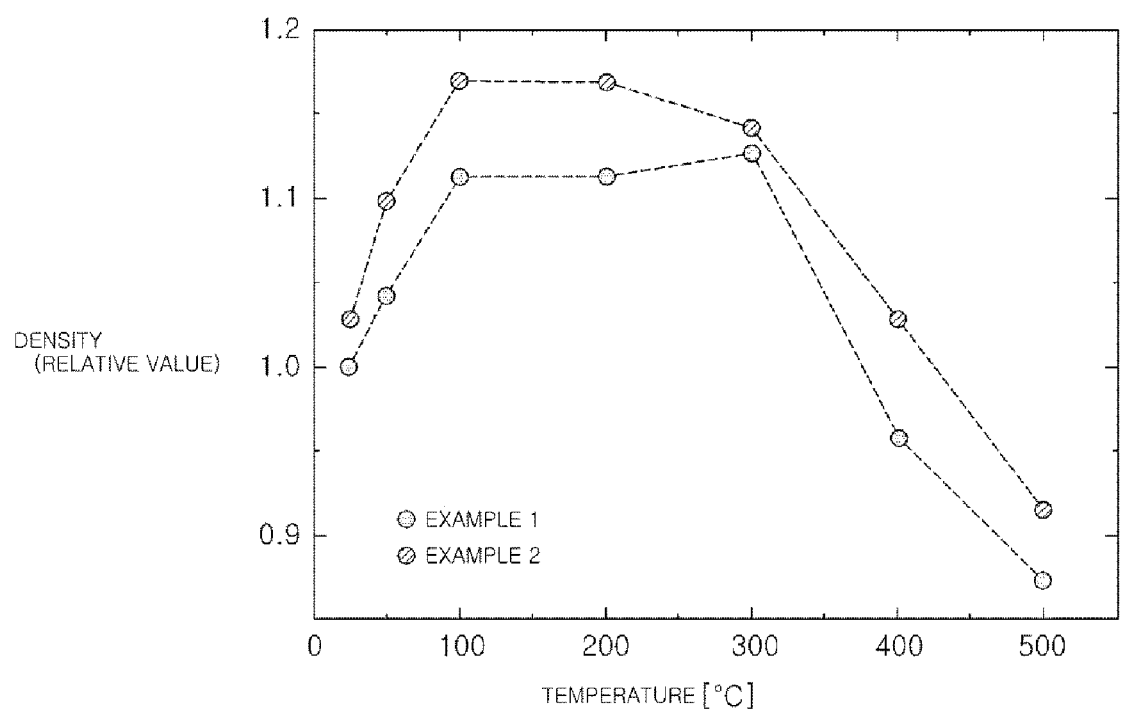
FIG. 8 is a graph illustrating relative values of the density of charging of a plurality of solar cells manufactured according to Experimental Example 2 of the present invention.

Referring to FIG. 8, it can be appreciated in the solar cells according to Example 1 that the density of charging when the post-treatment operation was performed at a temperature of 300° C. or less is higher than the density of charging when the post-treatment operation was performed at a temperature above 300° C. In addition, it can be appreciated that the density of charging is higher when the post-treatment operation was performed at temperatures within a range from about 50° C. to about 300° C. in the state in which heat was additionally provided than that when the post-treatment operation was performed at room temperature of about 20° C. in the state in which no heat was additionally provided. In particular, it can be appreciated that the density of charging is very high when the post-treatment operation is performed at temperatures within a range from about 100° C. to about 300° C.

In addition, it can be appreciated that the density of charging of Example 2 in which the post-treatment operation was performed simultaneously with the second drying operation is generally higher than the density of charging of Example 1, in which the post-treatment operation was performed after the second drying operation was performed. Because the properties of the first and second low-temperature paste layers may be somewhat deteriorated when the drying operation is repeated, it is expected that the density of charging is higher in Example 2, in which an additional post-treatment operation is not performed, as a result of minimizing the number of times the first and second low-temperature paste layers were dried.

As is apparent from the above description, according to the present embodiment, when light is provided to a solar cell in a post-treatment operation, the amount of hydrogen included in amorphous semiconductor layers may be reduced, and the incidence of defects in interfaces therebetween may be reduced. At this time, this effect may be further enhanced when heat is also supplied. Thereby, deterioration of the amorphous semiconductor layers may be effectively prevented. In addition, the conductivity of electrodes may be enhanced. In this way, the efficiency of the solar cell may be enhanced owing to, for example enhancement in the density of charging of the solar cell.

The above described features, configurations, effects, and the like are included in at least one of the embodiments of the present invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the invention as disclosed in the accompanying claims.

What is claimed is:

1. A method of manufacturing a solar cell, the method comprising:
    forming a photoelectric converter including an amorphous semiconductor layer;
    forming an electrode connected to the photoelectric converter; and
    performing a post-treatment by providing light to the photoelectric converter and the electrode,
    wherein, in the performing of the post-treatment, heat is provided along with the light, and
    the heat is used in heating the photoelectric converter via an atmospheric heating method that heats an atmosphere of a main area of a post-treatment apparatus by radiation.

2. The method according to claim 1, wherein the photoelectric converter includes:
a semiconductor substrate;
a tunneling film located on the semiconductor substrate; and
a conductive area located on the tunneling film, and
wherein at least one of the tunneling film and the conductive area is configured as the amorphous semiconductor layer.

3. The method according to claim 2, wherein the conductive area is configured as an amorphous silicon layer, an amorphous silicon carbide layer, or an amorphous silicon oxide layer, and including a p-type or n-type dopant, and
wherein the tunneling film is configured as an intrinsic amorphous silicon layer, an amorphous silicon carbide layer, or an amorphous silicon oxide layer.

4. The method according to claim 2, wherein the electrode is formed over an entirety of the conductive area, and includes a first electrode layer formed of a transparent conductive material and a second electrode layer formed on the first electrode layer and having a pattern, and
wherein the second electrode layer is formed by forming and drying a paste layer that includes a solvent, a conductive material, and a binder.

5. The method according to claim 2, wherein the tunneling film includes a first tunneling film located on a first surface of the semiconductor substrate, and a second tunneling film located on a second surface of the semiconductor substrate, and
wherein the conductive area includes a first conductive area located on the first tunneling film, and a second conductive area located on the second tunneling film.

6. The method according to claim 1, wherein, in the performing of the post-treatment, the light has a luminous intensity within a range from 100 W/m$^2$ to 30000 W/m$^2$.

7. The method according to claim 6, wherein, in the performing of the post-treatment, the luminous intensity of the light is within a range from 100 W/m$^2$ to 20000 W/m$^2$.

8. The method according to claim 1, wherein, in the performing of the post-treatment, any one of a xenon lamp, a halogen lamp, a laser, a plasma lighting system (PLS), and a light-emitting diode (LED) is used as a light source.

9. The method according to claim 1, wherein, in the performing of the post-treatment, a processing temperature is within a range from 15° C. to 300° C.

10. The method according to claim 9, wherein, in the performing of the post-treatment, the processing temperature is within a range from 100° C. to 300° C.

11. The method according to claim 10, wherein, in the performing of the post-treatment, the processing temperature is within a range from 200° C. to 300° C.

12. The method according to claim 1, wherein, in the performing of the post-treatment, the light has a wavelength within a range from 300 nm to 1000 nm.

13. The method according to claim 12, wherein the wavelength of the light is within a range from 400 nm to 800 nm.

14. The method according to claim 1, wherein, in the performing of the post-treatment, a processing time is within a range from 30 seconds to 1 hour.

15. The method according to claim 14, wherein, in the performing of the post-treatment, the processing time is within a range from 1 minute to 30 minutes.

16. The method according to claim 1, wherein the performing of the post-treatment may be performed after the forming of the electrode, or may be performed simultaneously with at least part of the forming of the electrode.

17. The method according to claim 16, wherein the forming of the electrode includes:
forming a paste layer including a solvent, a conductive material, and a binder; and
drying the paste layer so as to form an electrode layer including the conductive material and the binder, and
wherein the performing of the post-treatment may be performed after or simultaneously with the drying.

18. The method according to claim 17, wherein the electrode includes a first electrode layer formed over an entire conductive area using a transparent conductive material, and a second electrode layer formed on the first electrode layer and having a pattern, and
wherein the second electrode layer is formed by the forming of the paste layer and the drying.

19. The method according to claim 17, wherein the paste layer lacks a glass frit.

20. The method according to claim 1, wherein the post-treatment includes a first operation and a second operation, and
wherein the first operation provides only the heat, and the second operation provides the heat and the light together.

21. The method according to claim 20, wherein the heat provided in the second operation has a temperature that is equal to or greater than a temperature of the heat provided in the first operation.

22. The method according to claim 1, wherein, in the performing the post-treatment, the light has a wavelength that is equal to or less than 400 nm or less and has a luminous intensity within a range from 100 W/m$^2$ to 5000 W/m$^2$.

23. A method of manufacturing a solar cell, the method comprising:
forming a photoelectric converter including an amorphous semiconductor layer;
forming an electrode connected to the photoelectric converter; and
performing a post-treatment by providing light to the photoelectric converter and the electrode,
wherein, the performing of the post-treatment includes a first operation and a second operation, and
the first operation is an operation of supplying only heat via a heater, and the second operation is an operation of supplying the heat and light at the same time using the heater and a light source unit.

24. The method according to claim 23, wherein the post-treatment operation is performed at temperatures within a range from 100° C. to 300° C.

* * * * *